US012581763B2

(12) United States Patent
Lim

(10) Patent No.: US 12,581,763 B2
(45) Date of Patent: Mar. 17, 2026

(54) IMAGE SENSOR

(71) Applicant: SAMSUNG ELECTRONICS CO., LTD., Suwon-si (KR)

(72) Inventor: Jungwook Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 320 days.

(21) Appl. No.: 18/233,100

(22) Filed: Aug. 11, 2023

(65) Prior Publication Data

US 2024/0072092 A1 Feb. 29, 2024

(30) Foreign Application Priority Data

Aug. 31, 2022 (KR) ........................ 10-2022-0109885

(51) Int. Cl.
H10F 39/00 (2025.01)

(52) U.S. Cl.
CPC ......... H10F 39/809 (2025.01); H10F 39/811 (2025.01)

(58) Field of Classification Search
None
See application file for complete search history.

(56) References Cited

U.S. PATENT DOCUMENTS 6,258,691 B1 7/2001 Kim
9,337,228 B2 5/2016 Sa et al.

10,116,891 B2 10/2018 Raynor
10,163,946 B2 12/2018 Kwon
10,218,924 B2 2/2019 Manabe et al.
10,573,679 B2 2/2020 Kwon
11,206,367 B1 12/2021 Shim
11,665,452 B2 * 5/2023 Baek .................... H04N 25/778
257/306
2017/0345854 A1 * 11/2017 Kwon ................... H10F 39/802
2023/0299099 A1 * 9/2023 Lim ..................... H10F 39/8033
2023/0369375 A1 * 11/2023 Lim ........................ H10F 39/18
2024/0234452 A9 * 7/2024 Lim .................... H10F 39/8027

FOREIGN PATENT DOCUMENTS

KR 10-2000-0008804 A 2/2000

* cited by examiner

*Primary Examiner* — Benjamin P Sandvik
(74) *Attorney, Agent, or Firm* — Fish & Richardson P.C.

(57) ABSTRACT

An image sensor includes a first chip including a first substrate having a plurality of pixels, and a first wiring structure, each of the plurality of pixels including first and second isolated photodiodes; a second chip including a second wiring structure, and a second substrate; and a third chip including a third wiring structure, and a third substrate having logic devices, wherein each of the plurality of pixels includes a first floating diffusion node on the first photodiode, a second floating diffusion node on the second photodiode, a third floating diffusion node between the first and second floating diffusion nodes on the second photodiode, and a first switching transistor on the second substrate, and wherein the first switching transistor is connected to the first floating diffusion node through the first and second wiring structures, and the third floating diffusion node through the first and second wiring structures.

20 Claims, 8 Drawing Sheets

IMAGE SENSOR

CROSS TO REFERENCE TO RELATED APPLICATION(S)

This application claims the benefit of priority to Korean Patent Application No. 10-2022-0109885 filed on Aug. 31, 2022 in the Korean Intellectual Property Office, the disclosure of which is incorporated herein by reference in its entirety.

BACKGROUND

Exemplary embodiments of the present disclosure relate to an image sensor.

An image sensor may capture a two-dimensional or three-dimensional image of an object. An image sensor may generate an image of an object using a photoelectric conversion element reacting in response to intensity of light reflected from the object. With the recent developments in complementary metal-oxide semiconductor (CMOS) technology, a CMOS image sensor using a CMOS has been widely used. Recently, to increase the dynamic range of an image sensor, a technique for adding a capacitor in a pixel has been developed.

SUMMARY OF THE INVENTION

An exemplary embodiment of the present disclosure provides an image sensor which may address issues in processes caused by introducing a capacitor and may improve reliability.

According to an exemplary embodiment of the present disclosure, an image sensor includes a first semiconductor chip including a first semiconductor substrate having a pixel array in which a plurality of pixels are arranged, and a first wiring structure disposed on the first semiconductor substrate, where each of the plurality of pixels includes a first photodiode and a second photodiode isolated from each other; a second semiconductor chip including a second wiring structure disposed on the first wiring structure and having a capacitor, and a second semiconductor substrate disposed on the second wiring structure; and a third semiconductor chip including a third wiring structure disposed on the second semiconductor chip, and a third semiconductor substrate disposed on the third wiring structure and having logic devices formed thereon, wherein each of the plurality of pixels includes a first floating diffusion node storing electric charges generated by the first photodiode on the first photodiode, a second floating diffusion node storing electric charges generated by the second photodiode on the second photodiode, a third floating diffusion node disposed between the first and second floating diffusion nodes on the second photodiode, and a first switching transistor formed on a lower surface of the second semiconductor substrate, and wherein the first switching transistor has a first end connected to the first floating diffusion node through a first path of the first and second wiring structures, and a second end connected to the third floating diffusion node through a second path of the first and second wiring structures.

According to another exemplary embodiment of the present disclosure, an image sensor includes a pixel array chip including a first semiconductor substrate having a pixel array in which a plurality of pixels are arranged, and a first wiring structure disposed on the first semiconductor substrate, where each of the plurality of pixels includes a first photodiode and a second photodiode isolated from each other; a memory chip including a second wiring structure disposed on the first wiring structure and having a capacitor, and a second semiconductor substrate disposed on the second wiring structure; and a logic chip having a third wiring structure disposed on the memory chip and a third semiconductor substrate disposed on the third wiring structure and having logic devices formed thereon, wherein each of the plurality of pixels includes a first floating diffusion node configured to store electric charges generated by the first photodiode on the first photodiode; a second floating diffusion node configured to store electric charges generated by the second photodiode on the second photodiode; a first switching transistor formed on a lower surface of the second semiconductor substrate and having a first end connected to the first floating diffusion node through a first path of the first and second wiring structures; a second switching transistor formed on a lower surface of the second semiconductor substrate and having a first end connected to the second floating diffusion node through a second path of the first and second wiring structures; and a third floating diffusion node formed on the lower surface of the second semiconductor substrate and connected between a second end of the first switching transistor and a second end of the second switching transistor.

According to a further exemplary embodiment of the present disclosure, an image sensor includes a first semiconductor chip including a first semiconductor substrate having a pixel array in which a plurality of pixels are arranged, and a first wiring structure disposed on the first semiconductor substrate, where each of the plurality of pixels includes a first photodiode and a second photodiode isolated from each other; and a second semiconductor chip including a second wiring structure disposed on the first wiring structure and having a capacitor and a second semiconductor substrate disposed on the second wiring structure, wherein the first wiring structure includes a first bonding insulating layer disposed on an uppermost portion of the first wiring structure and a first metal pad in the first bonding insulating layer, the second wiring structure includes a second bonding insulating layer disposed in a lowermost portion of the second wiring structure and in contact with the first bonding insulating layer, and a second metal pad connected to the first metal pad in the second bonding insulating layer, and a connection between the first and second metal pads providing electrical paths for the first and second wiring structures, wherein each of the plurality of pixels includes a first floating diffusion node configured to store electric charges generated by the first photodiode on the first photodiode; a second floating diffusion node configured to store electric charges generated by the second photodiode on the second photodiode; a third floating diffusion node disposed between the first and second floating diffusion nodes on the second photodiode; and a first switching transistor formed on a lower surface of the second semiconductor substrate, and wherein the first switching transistor has a first end connected to the first floating diffusion node through a first path of the first and second wiring structures, and a second end connected to the third floating diffusion node through a second path of the first and second wiring structures.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION OF THE INVENTION

Hereinafter, embodiments of the present disclosure will be described as follows with reference to the accompanying drawings.

Figure 1:
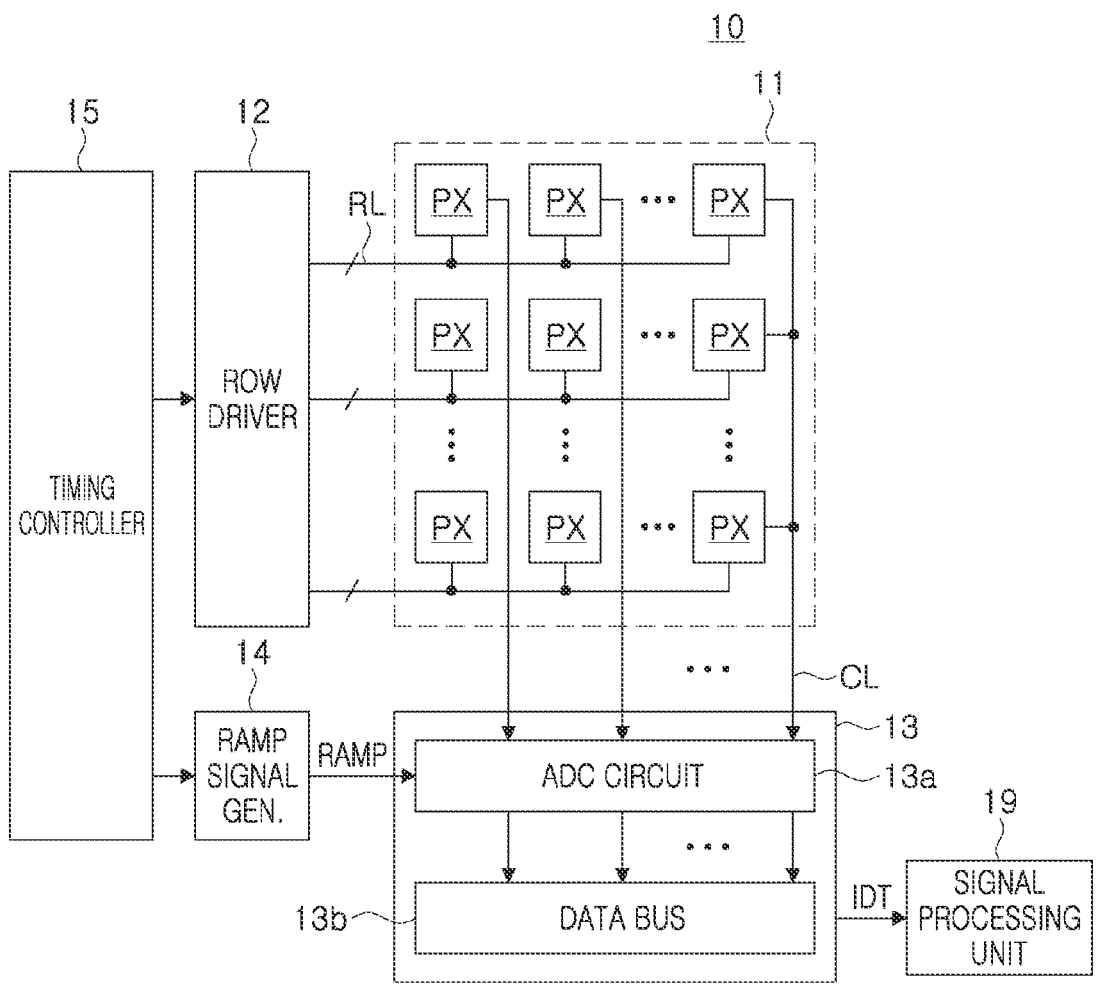
FIG. 1 is a block diagram illustrating an image sensor according to an exemplary embodiment of the present disclosure.

FIG. 1 is a block diagram illustrating a block diagram illustrating an image sensor according to an exemplary embodiment.

Referring to FIG. 1, an image sensor 10 according to an exemplary embodiment may include a pixel array 11, a row driver 12, a readout circuit 13, a ramp signal generator 14, a timing controller 15 and a signal processing unit 19. The readout circuit 13 may include an analog-to-digital conversion circuit 13*a* (hereinafter referred to as an ADC circuit) and a data bus 13*b*.

Figure 2:
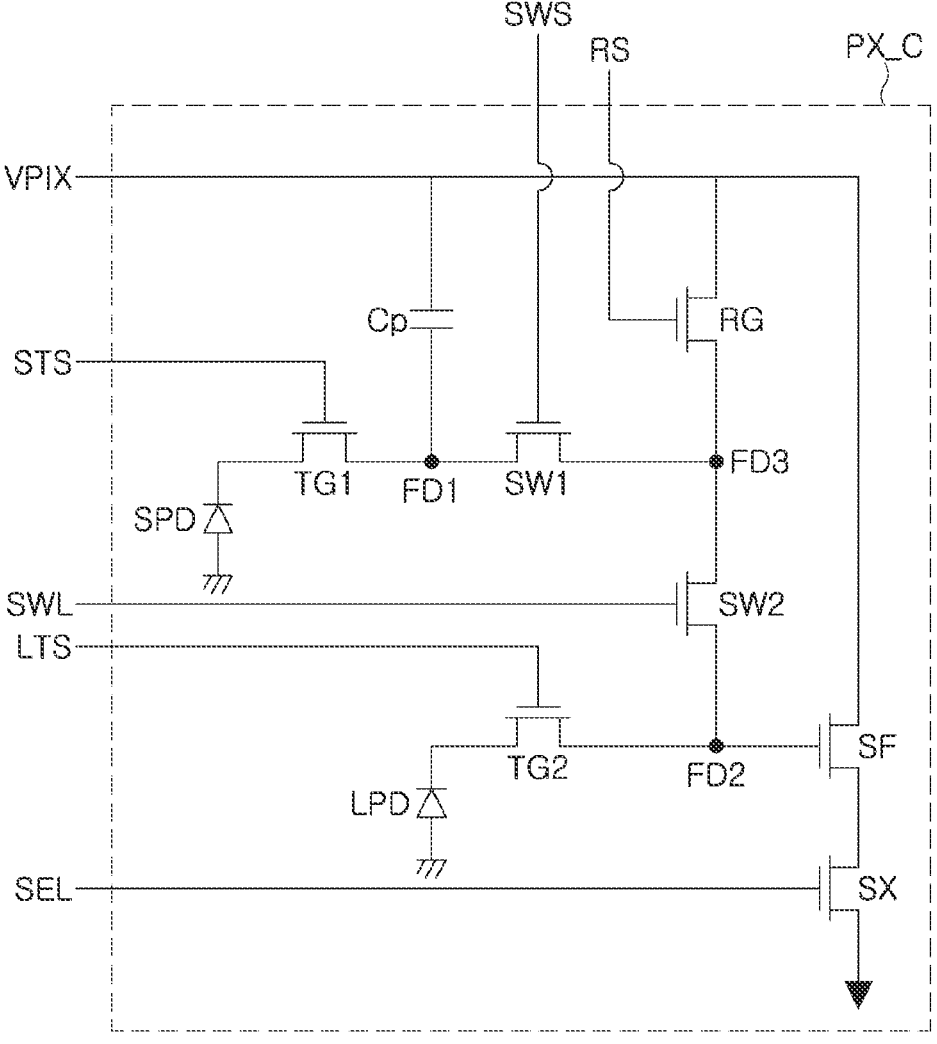
FIG. 2 is a circuit diagram illustrating an example of a pixel usable in an image sensor according to an exemplary embodiment of the present disclosure.

The pixel array 11 may include a plurality of pixels PX arranged in rows and columns, and a plurality of row lines RL and a plurality of column lines CL connected to the plurality of pixels PX. Each of the plurality of row lines RL may extend in a row direction and may be connected to pixels PXs disposed in the same row. For example, as illustrated in FIG. 2, each of the plurality of row lines RL may transmit control signals output by the row driver 12 to each transistor of the pixel circuit.

Each of the plurality of pixels PX may include at least one photoelectric conversion element (or referred to as a light sensing element). The photoelectric conversion element may sense light and may convert the sensed light into photoelectric charges. For example, the photoelectric conversion element may be a light sensing element such as an inorganic photodiode or an organic photodiode.

A microlens for condensing light may be disposed above each of the plurality of pixels PX or above each of pixel groups including adjacent pixels PX. Each of the plurality of pixels PX may sense light in a specific spectrum region from light received through the micro lens. For example, the pixel array 11 may include a red pixel for converting light in a red spectrum region into an electrical signal, a green pixel for converting light in a green spectrum region into an electrical signal, and a blue pixel array for converting light in a green spectrum region into an electrical signal. A color filter for transmitting light of a specific spectral region may be disposed above each of the plurality of pixels PX, but an exemplary embodiment thereof is not limited thereto. The pixel array 11 may include pixels converting light in spectral regions other than red, green, and blue into electrical signals.

In exemplary embodiments, the plurality of pixels PX may have a multilayer structure. The multilayer pixel PX may include a plurality of stacked photoelectric conversion elements converting light in different spectral regions into electrical signals, and electrical signals corresponding to different colors may be generated by the plurality of photoelectric conversion elements. That is, electrical signals corresponding to a plurality of colors may be output by one pixel PX.

A color filter array for transmitting light in a specific spectral region may be disposed above the plurality of pixels PX. A color which may be sensed by a corresponding pixel may be determined depending on a color filter disposed on each of the plurality of pixels PX, but an exemplary embodiment thereof is not limited thereto. In other exemplary embodiments, a specific photoelectric conversion element may convert light in a specific wavelength band into an electrical signal according to the level of the electric signal applied to the photoelectric conversion element.

A pixel PX employed in the exemplary embodiment may have a split photodiode structure including at least two photodiodes configured to be exposed to one or more light bursts from a light source. Here, two or more photodiodes may be exposed or blank independently of each other. For example, the pixel PX may include a small photodiode SPD having a small light-receiving area (also referred to as "first photodiode") and a large photodiode LPD having a light-receiving area larger than that of the small photodiode SPD (also referred to as "second photodiode") (see FIGS. 2 and 3). In exemplary embodiments, the large photodiode LPD may be responsible for a pixel signal of low luminance, the large photodiode LPD may operate in a high conversion gain HCG mode in the lowest luminance range and may operate in a low conversion gain LCG mode in a general low luminance range. The small photodiode SPD may operate in a high-illuminance range by lengthening the exposure time. In the highest luminance range, a large amount of signals may be stored using a capacitor (or memory) having high capacity while lowering sensitivity to maintain a long exposure time.

The photodiode may operate in a single exposure method or a multi exposure method. The multiple exposure method may have an advantage in dynamic range or SNR characteristics, but there may be a motion artifact or LED flicker problem due to the synthesis of images having different exposure times.

In exemplary embodiments, the pixel PX may use a single exposure method using a split photodiode structure, or may additionally mix and use multiple exposure methods for some illuminance ranges.

For example, the pixel PX may use a single exposure method of reading out a pixel signal using a large photodiode LPD in a first period for reading out a pixel signal corresponding to the lowest illuminance, and reading out a pixel signal using a small photo diode SPD in a second period for reading out a pixel signal corresponding to a illuminance higher than that of the first range. Furthermore, the pixel PX may secure a dynamic range by applying a multiple exposure method of performing additional exposure using a large photodiode LPD or a small photodiode SPD to read out a pixel signal corresponding to a level of illuminance higher than that of the second range.

Each of the plurality of column lines CL may extend in a column direction and may be connected to pixels PX disposed in the same column. Each of the plurality of column lines CL may transmit reset signals and sensing signals of the pixels PX to the readout circuit 13 in units of rows of the pixel array 11.

The timing controller 15 may control timing of the row driver 12, the readout circuit 13, and the ramp signal generator 14. The timing controller 15 may provide timing signals representing operation timings for each of the row driver 12, the readout circuit 13, and the ramp signal generator 14.

The row driver 12 may generate control signals for driving the pixel array 11 under control of the timing controller 15, and may provide control signals to each of the plurality of pixels PX of the pixel array 11 through the plurality of row lines RL. The row driver 12 may control the plurality of pixels PX of the pixel array 11 to sense incident light at the same time or in a row unit. Also, the row driver 12 may select the pixels PXs in a row unit among the plurality of pixels PXs, and may control the selected pixels PXs (e.g., pixels PXs in one row) to output reset signals and sensing signals through the plurality of column lines CL.

The row driver 12 may transmit control signals for outputting pixel signals to the pixel array 11. The pixel PX may generate control signals controlling the pixel PX to consecutively operate in a high conversion gain mode and a low conversion gain mode for a large photodiode LPD, and a high conversion gain mode and a low conversion gain mode for a small photo diode SPD during the readout period.

The ramp signal generator 14 may generate a ramp signal RAMP which increases or decreases with a predetermined slope and may provide the ramp signal RAMP to the ADC circuit 13a of the readout circuit 13. The readout circuit 13 may read out the reset signal and the sensing signal from the pixels PX of the row selected by the row driver 12 among the plurality of pixels PX. The readout circuit 13 may convert reset signals and sensing signals received from the pixel array 11 through a plurality of column lines CL into digital data based on the ramp signal RAMP from the ramp signal generator 14, thereby generating and outputting pixel values corresponding to the plurality of pixels PX.

The ADC circuit 13a may include a plurality of ADCs corresponding to a plurality of column lines CL, and each of the plurality of ADCs may compare the reset signal and the sensing signal received through the corresponding column line CL with the ramp signal RAMP respectively, and may generate a pixel value based on the comparison results.

A plurality of pixel values generated by the ADC circuit 13a may be output as image data IDT through the data bus 13b. For example, the image data IDT may be provided to an internal or external image signal processing unit 19 of the image sensor 10.

The data bus 13b may temporarily store the pixel value output by the ADC circuit 13a and output the pixel value. The data bus 13b may include a plurality of column memories and column decoders. The plurality of pixel values stored in the plurality of column memories may be output as image data IDT under control of the column decoder.

The ADC circuit 13a may include a plurality of CDS circuits (not illustrated) and a plurality of counter circuits (not illustrated). The ADC circuit 13a may convert a pixel signal (e.g., pixel voltage) input from the pixel array 11 into a pixel value which is a digital signal. Each pixel signal received through each of the plurality of column lines CL may be converted into a pixel value, which is a digital signal, by the CDS circuit and the counter circuit.

The CDS circuit may compare the pixel signal received through the column line CL with the ramp signal RAMP and may output a comparison result. The CDS circuit may output a comparison signal which transitions from a first level (e.g., logic high) to a second level (e.g., logic low) when the level of the ramp signal RAMP is equal to the level of the pixel signal. A time point at which the level of the comparison signal transitions may be determined according to the level of the pixel signal. The CDS circuit may sample and hold a pixel signal provided from the pixel PX according to a correlated double sampling (CDS) method, may double-sample the level of a specific noise (e.g., reset signal) and the level according to the image signal (sensing signal), and may generate a comparison signal based on a level corresponding to the difference therebetween. In exemplary embodiments, the CDS circuit may include one or more comparators. The comparator may be implemented as an operational transconductance amplifier (OTA) (or differential amplifier), for example. The ADC circuit 13a may include a plurality of delta reset sampling (DRS) circuits (not illustrated). The DRS circuit may sample a pixel signal provided by reading out the pixel signal by a delta reset sampling (DRS) method and reading out the reset signal.

In the pixel array 11 according to an exemplary embodiment, the pixel PX may have a dual conversion gain. The dual conversion gain may include a low conversion gain and a high conversion gain. Here, the conversion gain may refer to a rate at which electric charges accumulated in the floating diffusion nodes (FD1, FD2, and FD3 in FIG. 2) are converted into a voltage. The electric charges generated by the photoelectric conversion device may be transferred to the floating diffusion node and accumulated therein, and the electric charges accumulated in the floating diffusion node may be converted into a voltage according to a conversion gain.

For example, in the first image data generated as the large photodiode LPD operates in the HCG mode (LPD-H mode) in the plurality of pixels PX of the pixel array 11, the first region (the darkest region) may be clearly represented, and in the second image data generated as the large photodiode LPD operates in the LCG mode (LPD-L mode) in the plurality of pixels PX of the pixel array 11, the second region (region brighter than the first region) may be clearly represented. In the third image data generated as the small photodiode SPD operates in the HCG mode (SPD-H mode) in the plurality of pixels PX of the pixel array 11, the third region (a region brighter than the second region and darker than the fourth region described later) may be clearly represented, and in the fourth image data generated as the small photodiode (SPD) operates in the LCG mode (SPD-L mode) in the plurality of pixels PX of the pixel array 11, the fourth region (the brightest region) may be clearly represented.

In exemplary embodiments, the LPD-H mode, the LPD-S mode, the SPD-H mode, and the SPD-L mode in a readout period corresponding to each of the plurality of pixels PX within one frame in which the pixel array 11 is scanned may continuously operate, and accordingly, the first image data to the fourth image data may be generated in a single frame period. A one-shot image with a high dynamic range in which bright regions (high luminance regions) and dark regions (low luminance regions) are clearly implemented may be generated by merging the first to fourth image data.

In exemplary embodiments, the image sensor 10 may further include a bias current controller for increasing or decreasing a bias current when the conversion mode of the pixel PX is changed (e.g., from LCG mode to HCG mode or from HCG mode to LCG mode) during the readout period, and a plurality of bias current controllers may be connected to each of the plurality of column lines CL. When the conversion mode of the pixel PX is changed, the bias current may change, and the amount of bias current may increase or decrease depending on whether the pixel PX operates in the LCG mode or the HCG mode. For example, when the pixel PX operates in the HCG mode, the amount of bias current may be less than that when the pixel PX operates in the LCG mode.

The signal processing unit 19 may perform noise reduction processing, gain adjustment, waveform shaping processing, interpolation processing, white balance processing, gamma processing, edge enhancement processing, and binning on image data. In the exemplary embodiment, the pixel array 11 operates in a high conversion gain LPD-H mode for a large photodiode LPD, a low conversion gain LPD-L mode for a large photodiode LPD, a high conversion gain SPD-H mode for the small photodiode SPD, and a low conversion gain SPD-L mode for the small photodiode SPD in one frame period, such that the signal processing unit 19 may receive first image data according to the LPD-H mode, second image data according to the LPD-L mode, third image data according to the SPD-H mode, and fourth image data according to the SPD-L mode from the data bus 13*b*, and may generate an image having a high dynamic range by merging the first image data to the fourth image data.

FIG. 2 is a circuit diagram illustrating an example of a pixel usable in an image sensor according to an exemplary embodiment.

The pixel PX may include a plurality of photodiodes, for example, a large photodiode LPD having a large light-receiving area and a small photodiode SPD having a small light-receiving area. The pixel PX may include a plurality of transistors, for example, a first transfer transistor TG1 for the small photodiode SPD, a second transfer transistor TG2 for the large photodiode LPD, a reset transistor RG, a source follower transistor SF (also referred to as a "driving transistor"), a select transistor SX, a first switch transistor SW1, a second switch transistor SW2 (also referred to as a "conversion gain control transistor") and a capacitor Cp.

In an exemplary embodiment, each of the capacitor voltages applied to the capacitor Cp and the reset voltage applied to one end of the reset transistor RG may be supplied as the same as the pixel voltage VPIX, but other exemplary embodiments, each of the capacitor voltage and the reset voltage may be supplied to a circuit separate from the pixel voltage VPIX.

A capacitor, for example, a parasitic capacitor, may be formed by the first to third floating diffusion nodes FD1, FD2, and FD3. The capacitor Cp may be a passive element having a fixed or variable capacitance. In an exemplary embodiment, the capacitor Cp may be a hole structure capacitor employed in DRAM (see FIGS. 4 and 6).

A photodiode may convert light incident from the exterior into an electrical signal. A photodiode may generate electric charges according to the intensity of light detected. The amount of electric charges generated by the photodiode may vary according to the image capturing environment (low or high illuminance). For example, the amount of electric charges generated in a photodiode in a high light environment may reach the photodiode's full well capacity (FWC), but not so in a low light environment, the amount of electric charges may not reach the full well capacity. Photodiodes may be classified into large photodiodes LPD and small photodiodes SPD according to their relative light-receiving areas.

One end of the first transfer transistor TG1 may be connected to the small photodiode SPD, and the other end may be connected to the first floating diffusion node FD1 such that electric charges accumulated in the small photodiode SPD may be stored in the first floating diffusion node FD1. One end of the first switch transistor SW1 may be connected to the first floating diffusion node FD1, and the other end of the first switch transistor SW1 may be connected to the third floating diffusion node FD3. The first switch transistor SW1 may be turned on when the small photodiode SPD is used, and the first switch transistor SW1 may be turned off when the large photodiode LPD is used. The capacitor Cp may be connected to the first floating diffusion node FD1 and may increase capacitance of the first floating diffusion node FD1. Since the small photodiode SPD has a small electric charge capacity, electric charges may overflow from the small photodiode SPD to the first floating diffusion node FD1 during the exposure time. The capacitor Cp may store overflowed electric charge. The other end of the capacitor Cp may be connected to the pixel voltage VPIX provided as the capacitor voltage.

One end of the second transfer transistor TG2 may be connected to the large photodiode LPD, and the other end may be connected to the second floating diffusion node FD2, such that electric charges accumulated in the large photodiode LPD may be stored in the second floating diffusion node FD2. One end of the reset transistor RG may be connected to the pixel voltage VPIX provided as a reset voltage, and the other end of the reset transistor RG may be connected to the third floating diffusion node FD3 such that the pixel PX may be reset when the reset control signal RS is applied. One end of the second switch transistor SW2 may be connected to the third floating diffusion node FD3 and the other end of the second switch transistor SW2 may be connected to the second floating diffusion node FD2 such that the conversion gain may be adjusted while the large photodiode LPD operates.

The first transfer transistor TG1, the second transfer transistor TG2, the reset transistor RG, the source follower transistor SF, the select transistor SX, the first switch transistor SW1, and the second switch transistor SW2 may operate in response to control signals provided from the row driver 12, for example, first and second transfer control signals STS and LTS, a reset control signal RS, a select control signal SEL, a first switch signal SWS, and a second switch signal SWL (also referred to as "gain control signal").

The reset transistor RG may be turned on in response to the reset control signal RS applied to the gate end, and may reset first to third floating diffusion nodes FD1, FD2, and FD3 based on the reset voltage (the pixel voltage VPIX in the exemplary embodiment). In this case, as the first switch transistor SW1 is turned on together based on the first switch signal SWS received in the gate end, the reset voltage may be applied to the first floating diffusion node FD1 and the first floating diffusion node FD1 may be reset.

The first transfer transistor TG1 may be turned on in response to the first transfer control signal STS applied to the gate end, and may transfer electric charges generated by the small photodiode SPD to the first floating diffusion node FD1. Transferred electric charges may be accumulated in the first floating diffusion node FD1. In other words, electric charges may be accumulated in the capacitor formed in the first floating diffusion node FD1.

The second transfer transistor TG2 may be turned on in response to the second transfer control signal LTS applied to the gate end, and may transfer electric charges generated by the large photodiode LPD to the second floating diffusion node FD2. Electric charges may be accumulated in a capacitor formed in the second floating diffusion node FD2. In this case, when the second switch transistor SW2 is turned on, electric charges may be accumulated in the capacitor formed in the third floating diffusion node FD3. In other words, when the second switch transistor SW2 is turned on, the capacitor formed in the third floating diffusion node FD3 and the capacitor formed in the second floating diffusion node FD2 may be connected in parallel and the level of capacitance may increase.

The source follower transistor SF may operate as a source follower based on a bias current generated by a current source connected to a column line, and may output a voltage (a pixel signal) corresponding to the voltage of the floating diffusion node through the selection transistor SX.

The selection transistor SX may select the pixel PX. The selection transistor SX may be turned on in response to the select control signal SEL applied to the gate end, and may output the voltage (or current) output by the source follower transistor SF to the column line.

When the large photodiode LPD operates, the second switch transistor SW2 may be turned on or off based on the second switch signal SWL received by the gate end, and the conversion gain when the switch transistor SW2 is turned off may be higher than the conversion gain when the second switch transistor SW2 is turned on. When the second switch transistor SW2 is turned off, the state may be referred to as LPD-H mode, and when the second switch transistor SW2 is turned on, the state may be referred to as LPD-L mode.

In this way, since the pixel PX may sense light of low and high light using the photodiodes SPD and LPD having dual conversion gain, the dynamic range of the image sensor 10 may be expanded.

Figure 3:
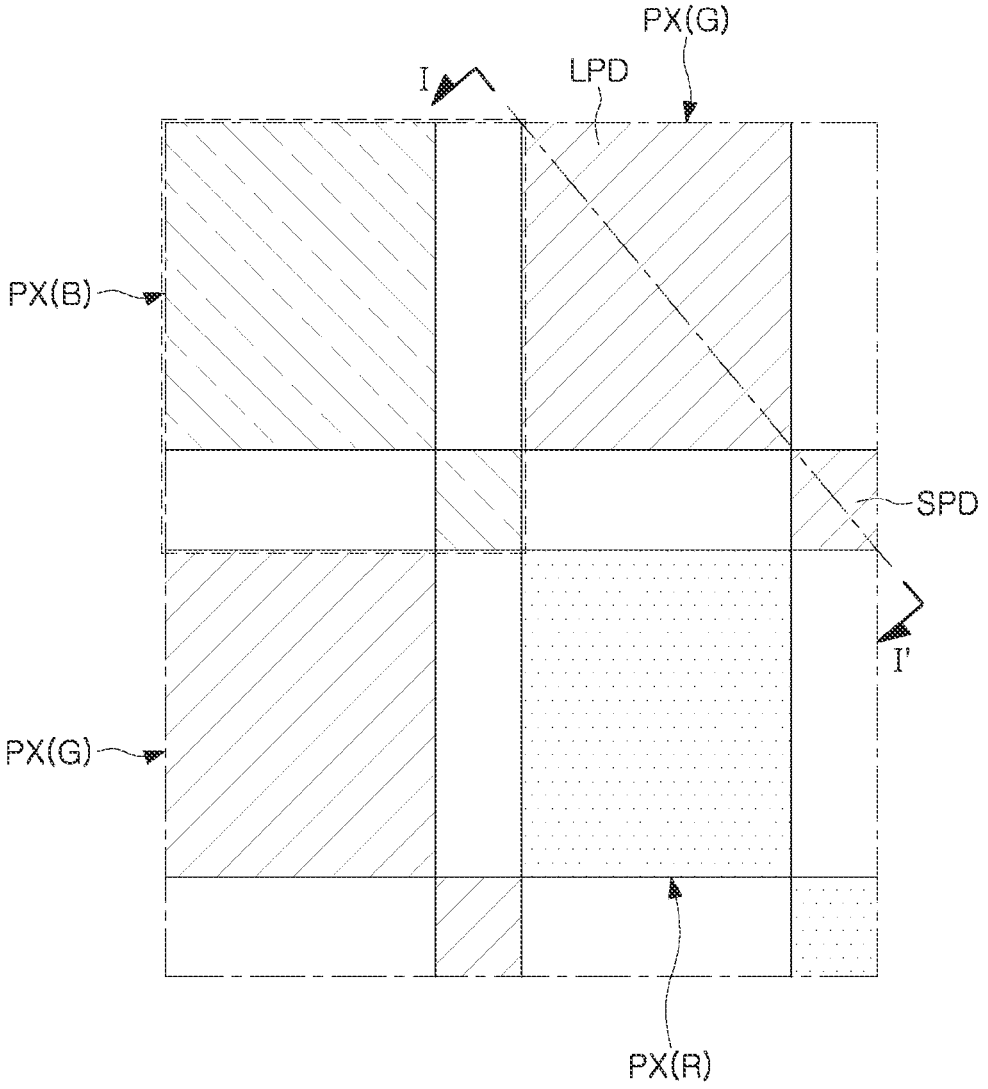
FIG. 3 is a plan diagram illustrating a split photodiode structure as an example of a pixel usable in an image sensor according to an exemplary embodiment of the present disclosure.

FIG. 3 is a plan diagram illustrating a split photodiode structure as an example of a pixel usable in an image sensor according to an exemplary embodiment.

Referring to FIG. 3, the pixel array 11 according to an exemplary embodiment may include a plurality of (e.g., four) pixels PXs arranged in rows and columns on a plane. The four pixels PX may be in a Bayer pattern arrangement including one blue pixel B, one red pixel R, and two green pixels G, but an exemplary embodiment thereof is not limited thereto. Each of the plurality of pixels PX may include a photoelectric conversion unit and a pixel circuit unit (see PX_C in FIG. 2). The photoelectric conversion unit may vertically overlap the pixel circuit unit and may include a photoelectric conversion element having a split photodiode structure.

As illustrated in FIG. 3, the photoelectric conversion element of each pixel PX may include a large photodiode LPD and a small photodiode SPD. In each pixel PX, the large photodiode LPD may have a relatively large region, and the small photodiode SPD may have a relatively small region. Since the large photodiode LPD has a large light-receiving area, the large photodiode LPD may be saturated faster than the small photodiode SPD. Accordingly, as described above, the large photodiode LPD may be used in a low-illuminance region and the small photodiode SPD may be used in a high-illuminance region.

As described above, in the split photodiode structure, a dynamic range may be extended by connecting a capacitor (e.g., DRAM) to the small photodiode. To prevent pixel contamination caused by the capacitor electrodes, the image sensor according to an exemplary embodiment may be formed on the second semiconductor chip (e.g., a memory chip) instead of being directly formed on a first semiconductor chip having a pixel array, and may be bonded to the first semiconductor chip, thereby preventing contamination of pixels during the process of forming an electrode. Also, a portion of the elements included in the pixel circuit may be formed on the substrate of the memory chip. In exemplary embodiments, an overflow problem occurring in a switching device due to a pixel isolation structure such as FDTI in a split photodiode structure as in the exemplary embodiment may be addressed by implementing the first switch transistor SW1 on the second semiconductor substrate.

Hereinafter, various examples (FIGS. 5, 7, and 8) of the image sensor according to further exemplary embodiments will be described.

Figure 4:
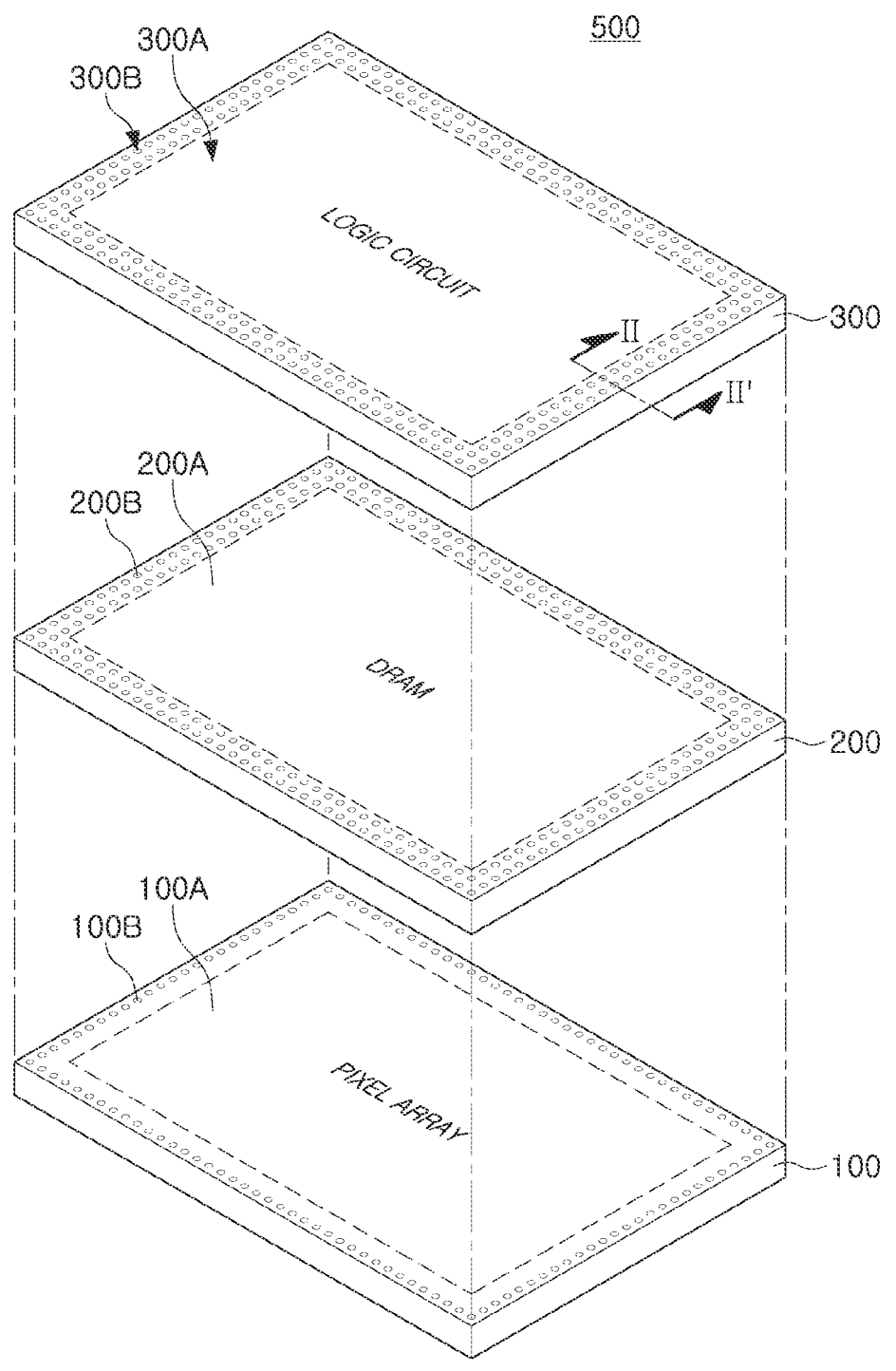
FIG. 4 is an exploded perspective diagram illustrating an image sensor according to an exemplary embodiment of the present disclosure.
Figure 5:
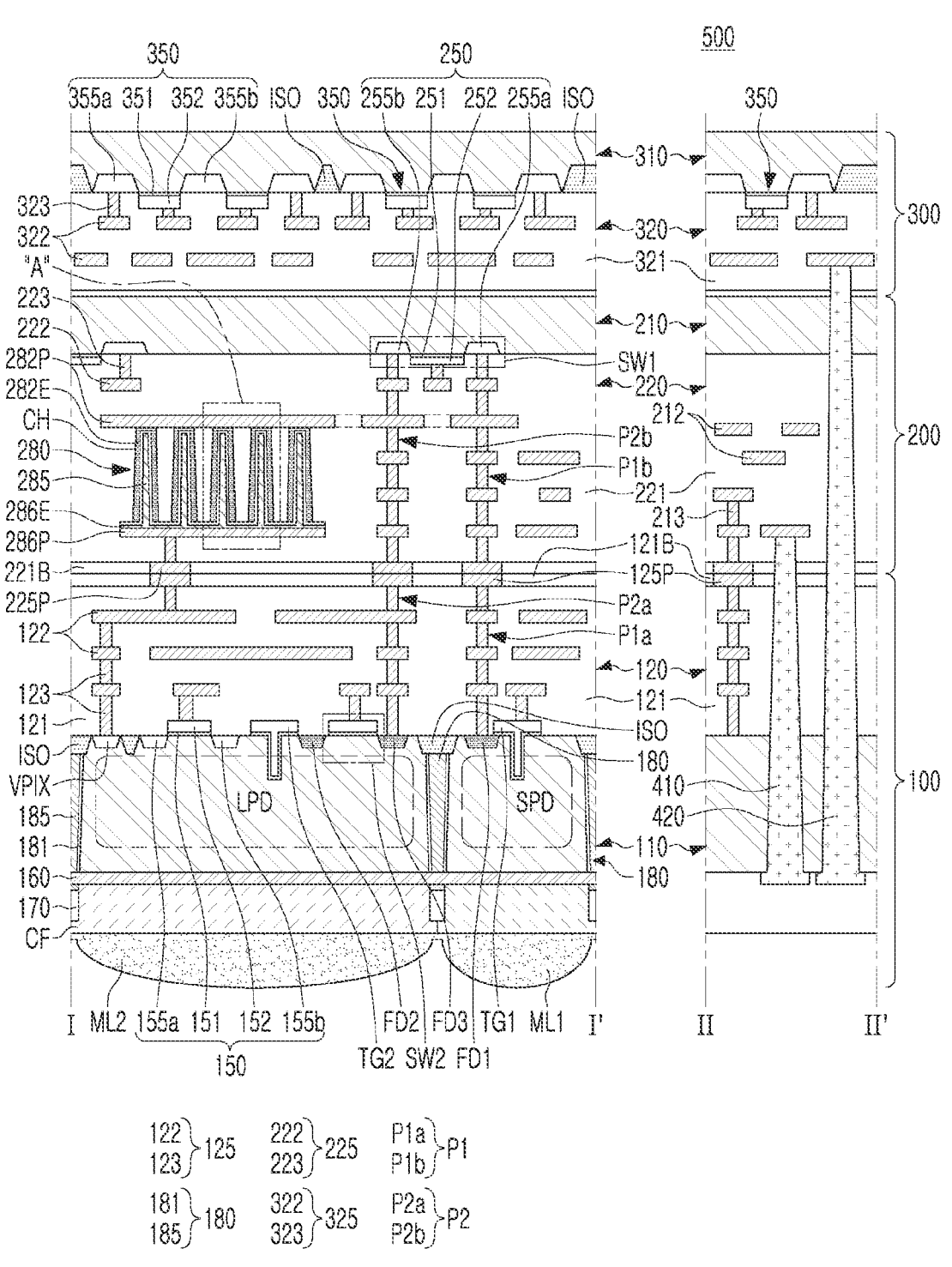
FIG. 5 are cross sectional diagrams illustrating the image sensor illustrated in FIG. 4, illustrating a pixel and a pixel circuit region.

FIG. 4 is an exploded perspective diagram illustrating the image sensor according to an exemplary embodiment. FIG. 5 are cross-sectional diagrams illustrating the image sensor illustrated in FIG. 4, illustrating a pixel region and a peripheral circuit region. In FIG. 5, a cross-section along I-I' may be of one main region in FIG. 3, and a cross-section along II-IP may be of a peripheral circuit region illustrated in FIG. 4.

Referring to FIG. 4, the image sensor 500 according to an exemplary embodiment may include a first semiconductor chip 100, a second semiconductor chip 200, and a third semiconductor chip 300 which may be stacked on each other. The first semiconductor chip 100, the second semiconductor chip 200, and the third semiconductor chip 300 may include main regions 100A, 200A, and 300A and peripheral regions 100B, 200B, and 300B surrounding the main regions 100A, 200A, and 300A.

For example, the main region 100A of the first semiconductor chip 100 may include a pixel array region in which the photoelectric conversion elements SPD and LPD and the pixel circuit PX_C are arranged (see "11" in FIG. 1), and the main region 200A of the second semiconductor chip 200 may include a memory region including a capacitor. Also, the main region 300A of the third semiconductor chip 300 may include a logic circuit region including a row driver, a readout circuit, a ramp signal generator, and a timing controller (see "12" to "15" in FIG. 1). In the peripheral regions 100B, 200B, and 300B of the first semiconductor chip 100, the second semiconductor chip 200, and the third semiconductor chip 300, peripheral circuits connected to the circuits of the main areas 100A, 200A, and 300A may be disposed.

The image sensor 500 may include through-vias 410 and 420 penetrating the peripheral regions 100B, 200B, and 300B such that peripheral circuits may be connected to each other. In the exemplary embodiment, the through-vias 410 and 420 may include the first through-vias 410 electrically and mechanically connecting the first semiconductor chip 100 to the second semiconductor chip 200 and second through-vias 420 connecting the first to third semiconductor chips 100, 200, and 300 to each other.

In an exemplary embodiment, the first semiconductor chip 100 and the second semiconductor chip 200 may be electrically connected to each other by bonding metal pads 125P and 225P together with through vias 410 and 420. A detailed description of bonding the metal pads 125P and 225P will be described later.

Referring to FIG. 5 together with FIG. 4, the first to third semiconductor chips 100, 200, and 300 may include first to third semiconductor substrates 110, 210, and 310 and first to third wiring structures 120, 220, and 320, respectively.

Specifically, the first semiconductor chip 100 may include a first semiconductor substrate 110 having a pixel array (11 in FIG. 1) in which a plurality of pixels PX are arranged, and a first wiring structure 120 disposed on the first semiconductor substrate 110. The first semiconductor chip 100 may also be referred to as a pixel array chip.

The first semiconductor substrate 110 may be a silicon substrate or a semiconductor substrate such as silicon germanium. Here, the upper surface of the first semiconductor substrate 110 may be referred to as a front side, and the lower surface of the first semiconductor substrate 110 may be referred to as a back side.

The first semiconductor substrate 110 may include a photoelectric conversion device SPD and LPD and a pixel isolation structure 180. The photoelectric conversion element employed in the exemplary embodiment may have a split photodiode structure including a first photodiode SPD having a small light receiving area and a second photodiode LPD having a large light receiving area. A lower surface of the first semiconductor substrate 110 may be a light receiving surface through which light is incident.

The pixel isolation structure 180 may be disposed between each of the plurality of pixels PX arranged in a matrix form and may define the plurality of pixels PX. In the exemplary embodiment, in the pixel isolation structure 180, the first and second photodiodes SPD and LPD may be physically and electrically isolated from each other. The pixel isolation structure 180 may have an FDTI structure penetrating the semiconductor substrate 110 from the upper surface to the lower surface of the semiconductor substrate 110. A deep trench for the pixel isolation structure 180 may be formed in the semiconductor substrate 110, and the pixel isolation structure 180 may include an insulating layer 181 conformally formed on an inner surface of the trench, and a conductive layer 185 filling the trench on the insulating layer 181. For example, the insulating layer 181 may include silicon oxide, silicon nitride, silicon oxynitride, hafnium oxide, aluminum oxide, or tantalum oxide. The conductive layer 185 may include at least one of doped polysilicon, a metal, a metal silicide, a metal nitride, or a metal-containing layer.

The first semiconductor devices 150 included in the pixel circuit PX_C described in FIG. 2 may be disposed on an upper surface of the first semiconductor substrate 110. The device isolation pattern ISO may be formed in the first semiconductor substrate 101 and may define an active region in which the first semiconductor devices 150 are to be formed. The device isolation pattern ISO may be formed, for example, by filling an insulating material in a shallow trench formed by patterning the first semiconductor substrate 110.

The first semiconductor devices 150 may include a portion of the elements included in the pixel circuit PX_C, and may include transistors including a gate electrode 152, a gate insulating film 151, and source/drain regions 155*a* and 155*b*.

The first semiconductor devices 150 may include a transistor such as the first and second transfer transistors TG1 and TG2, the second switching transistor SW2, the reset transistor RG, the source follower transistor SF, and the select transistor SX described above with reference to FIG. 2. The transistors may include a gate electrode 152 disposed on the upper surface of the first semiconductor substrate 110, a gate insulating film 151 between the gate electrode 152 and the first semiconductor substrate 110, and source/drain regions 155*a* and 155*b* disposed on both ends of the gate electrode 152. The source/drain regions 155*a* and 155*b* may be formed in the first semiconductor substrate 110 on both sides of the gate electrode 152. The source/drain regions 155*a* and 155*b* may be formed by doping impurities in the first semiconductor substrate 110.

At least a portion of the gate electrodes 152 of the first and second transfer transistors TG1 and TG2 may extend in a vertical direction and may be buried in the first semiconductor substrate 110. A first floating diffusion node FD1 may be formed on the first photodiode SPD to be connected to one end of the first transfer transistor TG1, and a second floating diffusion node FD2 may be formed on the second photodiode LPD. When the first transfer transistor TG1 is turned on, electric charges generated by the first photodiode SPD may be stored in the first floating diffusion node FD1. Similarly, when the second transfer transistor TG2 is turned on, electric charges generated by the second photodiode LPD may be stored in the second floating diffusion node FD2.

In an exemplary embodiment, the first switch transistor SW1 among elements included in the pixel circuit PX_C may be formed on the lower surface of the second semiconductor substrate 210 instead of the upper surface of the first semiconductor substrate 110.

In an exemplary embodiment, the first switch transistor SW1 connected between the first floating diffusion node FD1 and the third floating diffusion node FD3 may be formed on the lower surface of the second semiconductor substrate 210. To connect the first switch transistor SW1 to the first and third floating diffusion nodes FD1 and FD3 on the upper surface of the first semiconductor substrate, respectively, the wiring layers 125 and 225 of the first and second wiring structures 120 and 220 may be used.

Specifically, the first end of the first switch transistor SW1, that is, the source region 255*a* may be connected to the first floating diffusion node FD1 through the first path P1 of the first and second wiring structures 120 and 220, and the second end of the first switch transistor SW1, that is, the drain region 225*b* may be connected to the third floating diffusion node FD3 through the second path P2 of the first and second wiring structures 120 and 220. As opposed to the exemplary embodiments described herein, in the prior art, since the first switching transistor is formed on the second photodiode LPD divided by the pixel isolation structure 180 and is connected to the first floating diffusion node FD1 on one end thereof, reliability may be degraded due to overflow in the first switching transistor SW1. However, as in the exemplary embodiments, the overflow problem may be addressed by disposing the first switching transistor SW1 on the lower surface of the second semiconductor substrate 210.

The first wiring structure 120 disposed on the upper surface of the first semiconductor substrate 110 may include a first insulating layer 121 and a first wiring layer 125 disposed in the first insulating layer 121. The first wiring layer 125 may be connected to the first semiconductor devices 150 and may form a pixel circuit (PX_C in FIG. 2). The first wiring layer 125 may include a plurality of wiring lines 122 disposed at a plurality of levels within the first insulating layer 121 and wiring vias 123 connected to the plurality of wiring lines 122. For example, the first wiring layer 125 may include copper or a copper alloy.

The second semiconductor chip 200 may include a second wiring structure 220 disposed on the first wiring structure 120 and having a capacitor 280, and a second semiconductor substrate 210 disposed on the second wiring structure 220. The second semiconductor chip 200 may also be referred to as a "memory chip" such as a DRAM chip.

A second semiconductor chip 200 may be disposed on the first semiconductor chip 100. The first and second semiconductor chips 100 and 200 may be bonded such that the first and second wiring structures 120 and 220 may oppose each other.

The first wiring structure 120 may include a first bonding insulating layer 121B disposed on the first wiring structure 120 and a first metal pad 125P connected to the first wiring layer 125 in the first bonding insulating layer 121B. Similarly, the second wiring structure 220 may include a second bonding insulating layer 221B disposed in a lowermost portion of the second wiring structure 220 and a second metal pad 225P in the second bonding insulating layer 221B. The first metal pad 125P may have an upper surface substantially coplanar with the upper surface of the first bonding insulating layer 121B, and the second metal pad 225P may have an upper surface substantially coplanar with the upper surface of the second bonding insulating layer 221B.

The first and second metal pads 125P and 252P may be directly bonded and may form metal-to-metal bonding, and the first and second bonding insulating layers 121B and 221B may be directly bonded to each other and may form dielectric-to-dielectric bonding. Such bonding may also be referred to as hybrid bonding.

The first wiring layer 125 and the second wiring layer 225 may be electrically connected to each other by bonding between the first and second metal pads 125P and 225P. Bonding between the first and second metal pads 125P and 225P may electrically connect the peripheral regions 100B and 200B and also connect the first and second semiconductor chips 100 and 200 in the main regions 100A and 200B.

The directly bonded first and second metal pads 125P and 225P may be bonded by mutual diffusion of copper through a high-temperature annealing process. The metal included in the first and second metal pads 125P and 252P is not limited to copper, and may include other metal materials (e.g., Au) which may be similarly bonded to each other. Bonding between these pads may provide electrical connection with strong bonding. The first and second bonding insulating layers 121B and 221B may include the same dielectric material, for example, silicon oxide. In exemplary embodiments, the first and second bonding insulating layers 121B and 221B may include an insulating material different from that of the first and second insulating layers 121 and 221 or may further include an insulating film of a different material. For example, these other materials may include other insulating films such as SiCN, SiON or SiCO or the like.

Similarly to the first wiring structure 120, the second wiring structure 220 may include a second insulating layer 221 and a second wiring layer 225 disposed in the second insulating layer 221. The second wiring layer 225 may include a plurality of wiring lines 222 and wiring vias 223.

The second wiring layer 225 may be included in a pixel circuit (PX_C in FIG. 2) together with the first wiring layer 125 to which the first semiconductor devices 150 are connected. Specifically, the first wiring layer 125 may be connected to the second wiring layer 225 through bonding of the first and second metal pads 125P and 225P, and may form pixel circuits connected to the first and second photodiodes SPD and LPD.

Figure 6:
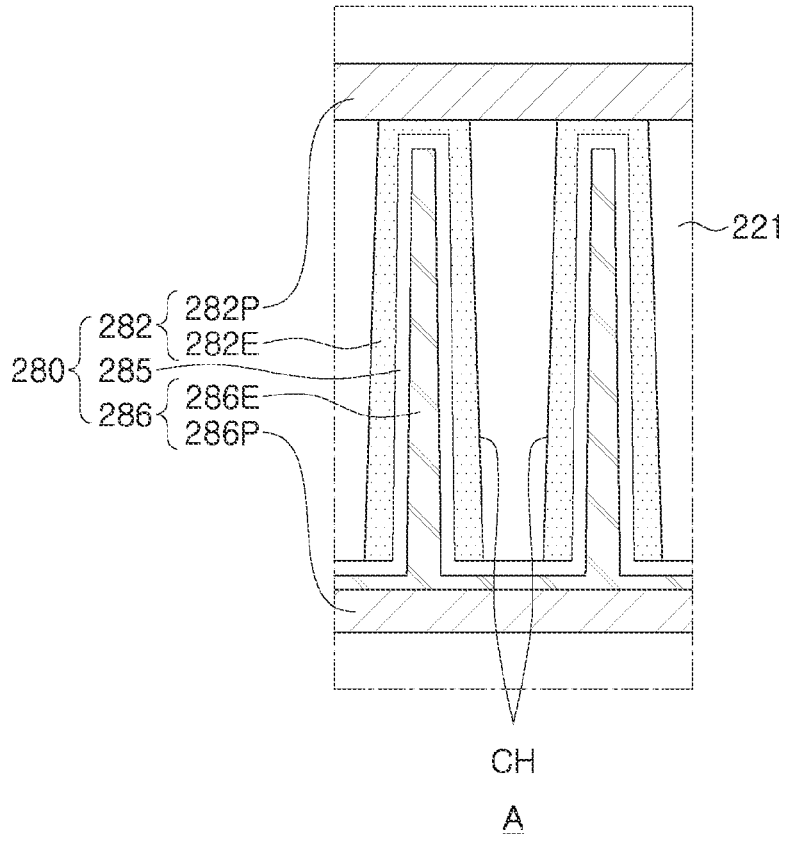
FIG. 6 is an enlarged diagram illustrating a capacitor portion of the image sensor illustrated in FIG. 4.

The second semiconductor chip 200 may include capacitors 280 having a cylindrical shape in the second wiring structure 220. FIG. 6 is an enlarged diagram illustrating the capacitor arrangement in FIG. 5.

Referring to FIG. 6, the capacitor 280 may include a first electrode 282 and a second electrode 286 and a dielectric layer 285 disposed therebetween. The first and second electrodes 282 and 286 may include first and second pad electrodes 282P and 286P and first and second electrode layers 282E and 286E, respectively.

A plurality of capacitor holes CH connected to the first pad electrode 282P may be formed in the second insulating layer 221, and the plurality of first electrode layers 282E may be formed in a cylindrical shape in the plurality of capacitor holes CH, respectively. The dielectric layer 285 may conformally cover the upper surface and the sidewall of each of the plurality of first electrode layers 282E, and the second electrode layer 286E may cover the dielectric layer 285. The second pad electrode 286P may be disposed in a flat plate shape on the upper surface of the second electrode layer 286E.

In an exemplary embodiment, the first electrode layer 282E may be directly connected to the first floating diffusion node FD1. Referring to FIG. 5, in the second wiring structure 220, the first electrode layer 282E may be directly connected to the first floating diffusion node FD1 by the second wiring layer 225 (see the dotted line). In other exemplary embodiments, the first electrode layer 282E and the first floating diffusion node FD1 may be connected through an additional third switch transistor (not illustrated).

The first electrode layer 282E and the second electrode layer 286E may include, for example, a high melting point metal film such as cobalt, titanium, nickel, tungsten, and molybdenum, and/or metal nitride films such as titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN) and tungsten nitride (WN), and combinations thereof, but exemplary embodiments thereof are not limited thereto. At least one of the first and second electrode layers 282E and 286E may include a metal material different from that of the first wiring layer 125 of the first wiring structure 120. In other exemplary embodiments, at least one of the first and second electrode layers 282E and 286E may include tungsten, and the first wiring layer 125 may include copper.

The dielectric layer 285 may include, for example, a metal oxide such as $HfO_2$, $ZrO_2$, $Al_2O_3$, $La_2O_3$, $Ta_2O_3$ and $TiO_2$, Perovskite-structured dielectric materials such as $SrTiO_3$ (STO), $(Ba,Sr)TiO_3$(BST), $BaTiO_3$, PZT, and PLZT, and any combination thereof, but exemplary embodiments thereof are not limited thereto. The dielectric layer 285 may be a single layer or multiple layers. The second pad electrode 286P may include at least one of, for example, a semiconductor material such as impurity-doped polysilicon and silicon germanium, and/or a metal such as tungsten, copper, aluminum, titanium, and tantalum, and any combinations thereof, but exemplary embodiments thereof are not limited thereto. In further exemplary embodiments, the second pad electrode 286P may include a material different from that of the second electrode layer 286E.

The first electrode 282 of the capacitor 280 may be connected to the first floating diffusion node FD1 (see the dotted line connection), and the second electrode 286 of the capacitor 280 may be connected to a power source such that a capacitor voltage is applied. In an exemplary embodiment, the capacitor voltage may be provided by the pixel voltage VPIX (see FIG. 2). Connection of the capacitor 280 may be implemented by the first wiring layer 125 and the second wiring layer 225.

Second semiconductor devices 250 formed in an active region defined by the device isolation pattern ISO may be formed on a lower surface of the second semiconductor substrate 210. As described above, the second semiconductor devices 250 may include at least one element among elements included in the pixel circuit (PX_C in FIG. 2).

As illustrated in FIG. 5, the first switch transistor SW1 may be formed on the lower surface of the second semiconductor substrate 210. Also, the first end of the first switch transistor SW1, that is, the source region 255a may be connected to the first floating diffusion node FD1 through the first path P1 of the first and second wiring structures 120 and 220, and the second end of the first switch transistor SW1, that is, the drain region 225b, may be connected to the third floating diffusion node FD3 through the second path P2 of the first and second wiring structures 120 and 220. The first path P1 may be configured by connecting the first path P1*a* of the first wiring layer 125 to the first path P1*b* of the second wiring layer 225 through metal bonding. The second path P2 may be isolated from the first path P1 and the second path P2*a* of the first wiring layer 125 and the second path P2*b* of the second wiring layer 225 may be connected by different metal bonds.

As such, in an exemplary embodiment, a portion of the elements included in the pixel circuit PX_C may be formed on the lower surface of the second semiconductor substrate 210, and the wiring layers of the first and second wiring structures 120 and 220 may be connected to other elements of the pixel circuit PX_C formed on the upper surface of the first semiconductor substrate 110 through paths P1 and P2.

The third semiconductor chip 300 may include a third wiring structure 320 disposed on the second semiconductor substrate 210 and a third semiconductor substrate 310 disposed on the third wiring structure 320 and having logic devices 350 implemented thereon. The third semiconductor chip 300 may also be referred to as a logic chip.

Similarly to the first and second wiring structures 110 and 220, the third wiring structure 320 may include a third insulating layer 321 and a third wiring layer 325 disposed in the third insulating layer 321. The third wiring layer 325 may include a plurality of wiring lines 322 and wiring vias 323.

Third semiconductor devices 350 may be formed on the lower surface of the third semiconductor substrate 310 in an active region defined by the device isolation pattern ISO. The third semiconductor devices 350 may be included in logic circuits, such as the row driver 12, the readout circuit 13, the ramp signal generator 14, and the timing controller 15.

In an exemplary embodiment, the third semiconductor chip 300 may be electrically connected to the first and second semiconductor chips 100 and 200 by the second through via 420, and similarly to the connection of the semiconductor chips 100 and 200, the connection between the second and third semiconductor chips 200 and 300 may be implemented by bonding with a metal pad similarly to the connection between the second and third semiconductor chips 200 and 300 instead of or in parallel with the second through via 420.

The image sensor 500 according to an exemplary embodiment may be disposed on the lower surface of the first semiconductor substrate, and may include an insulating material layer 160 having an antireflection film, a color filter CF disposed on the insulating material layer 160, and micro lenses ML1 and ML2. The color filters CF may be disposed in a plurality of pixel regions defined by the insulating grid structure 170, respectively. The micro lenses ML1 and ML2 may be disposed on the photoelectric conversion element, and may be configured to focus light incident from the exterior and may allow light to be incident into the photoelectric conversion element. The color filter CF may selectively transmit an optical signal of a specific wavelength band and may be interposed between the micro lenses ML1 and ML2 and the photoelectric conversion elements SPD and LPD.

In the image sensor 500 according to an exemplary embodiment, a capacitance element such as DRAM may be formed on the second semiconductor chip 200 instead of directly forming a capacitance element on the first semiconductor chip 100 having a pixel array, and may be bonded with the first semiconductor chip 100, thereby preventing contamination of pixels during the process of forming the electrode of the capacitance element. Also, by forming the first switch transistor SW1 of the pixel circuit on the lower surface of the second semiconductor substrate 200, in a split photodiode (split PD), the structural overflow problem caused by the pixel isolation structure 180 such as front-side deep trench isolation (FDTI) may be addressed.

The image sensor 500 according to an exemplary embodiment may be mounted in an electronic device having an image or light sensing function. For example, the image sensor 500 may be a camera, a smartphone, a wearable device, an Internet of Things (IoT) device, a home appliance, a tablet personal computer (PC), a personal digital assistant (PDA), a portable multimedia player (PMP), navigation, drones, advanced drivers assistance systems (ADAS), and the like. Also, the image sensor 500 may be mounted on electronic devices provided as components, such as vehicles, furniture, manufacturing facilities, doors, and various measuring devices.

Figure 7:
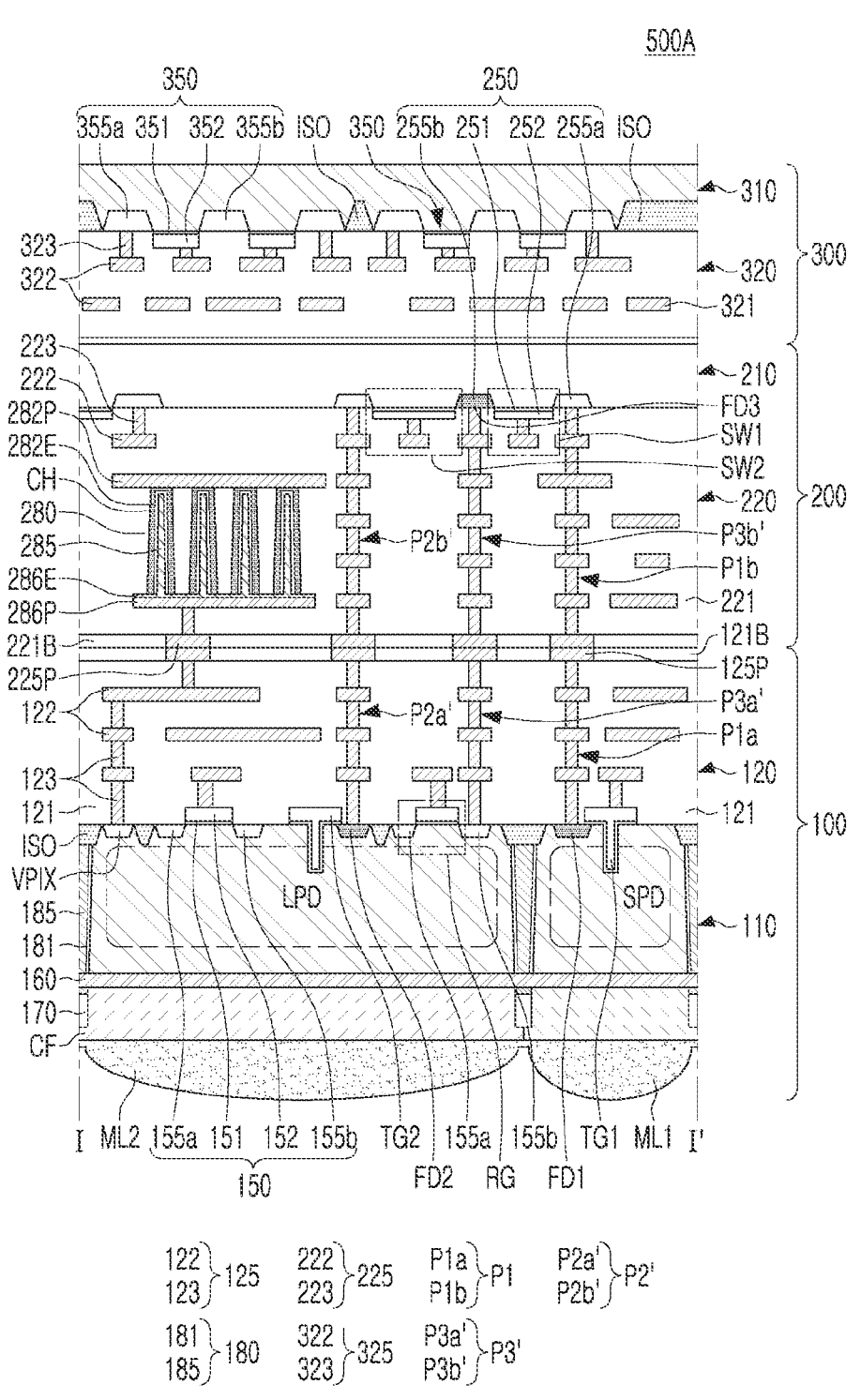
FIGS. 7 and 8 are cross-sectional diagrams illustrating an image sensor according to an exemplary embodiment of the present disclosure.
Figure 8:
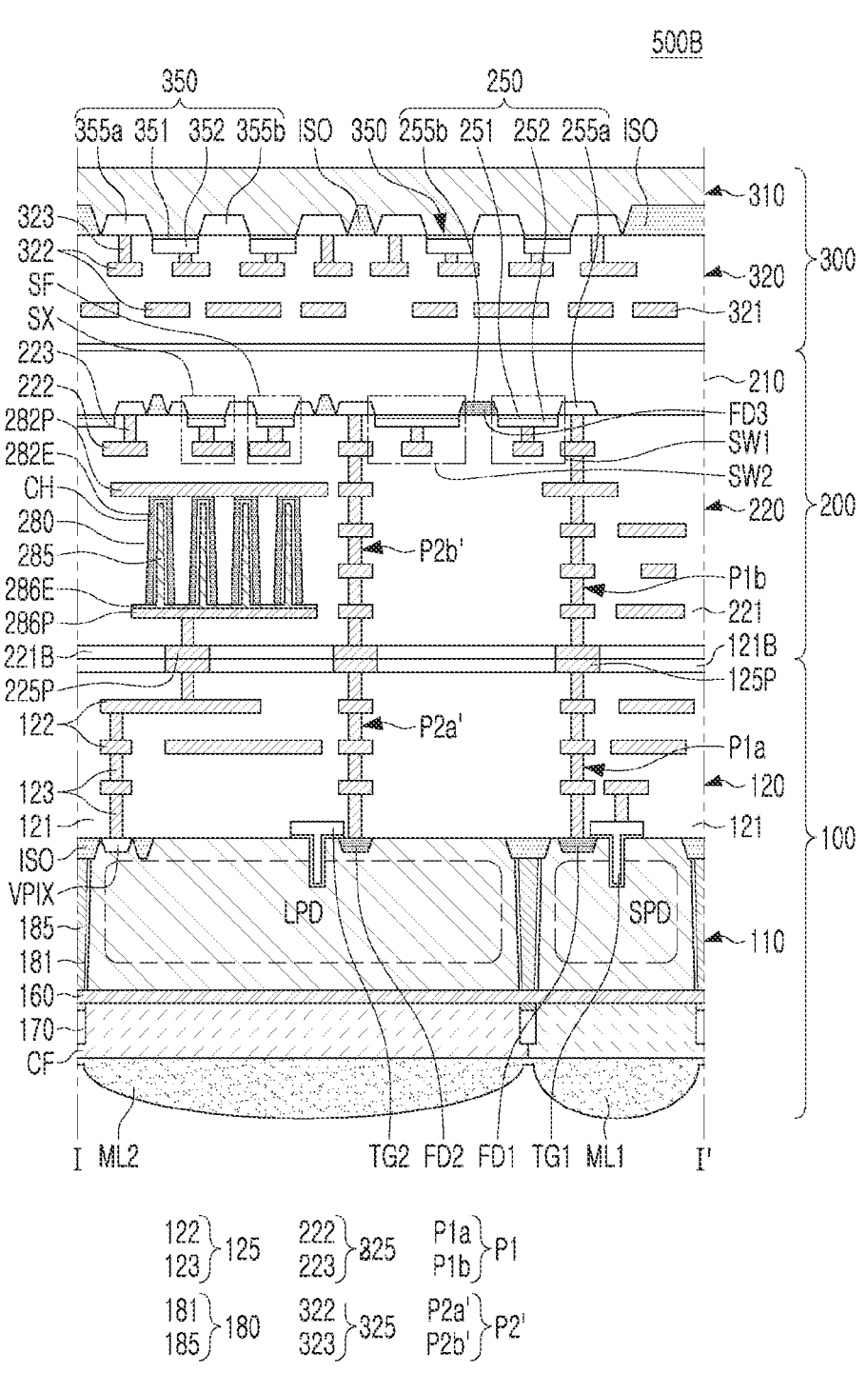

Differently from the aforementioned exemplary embodiment, elements other than the first switch transistor SW1 of the pixel circuit may be formed on the lower surface of the second semiconductor substrate 200. FIGS. 7 and 8 are side cross-sectional diagrams illustrating image sensors according to such exemplary embodiments.

Referring to FIG. 7, in the image sensor 500A according to an exemplary embodiment may be configured similarly to the image sensor 500 illustrated in FIGS. 1 to 6 other than the configuration in which the second switching transistor SW2 and the third floating diffusion node FD3 may be disposed on a lower surface of a second semiconductor substrate 210. Also, components of the exemplary embodiments may be understood with reference to descriptions of the same or similar components of the image sensor 500 illustrated in FIGS. 1 to 6 unless otherwise indicated.

In an exemplary embodiment, in each pixel, a first transfer transistor TG1 may be connected between the first photodiode SPD and the first floating diffusion node FD1, a first floating diffusion node FD1 may be disposed on the first photodiode SPD, and may store electric charges generated by the first photodiode SPD when the first transfer transistor TG1 is turned on. Similarly, the second transfer transistor TG2 may be connected between the second photodiode LPD and the second floating diffusion node FD2, the second floating diffusion node FD2 may be disposed on the second photodiode LPD, and may store electric charges generated by the second photodiode LPD when the second transfer transistor TG2 is turned on.

Similarly to the aforementioned exemplary embodiment, the first switching transistor SW1 may be formed on the lower surface of the second semiconductor substrate 210, and may have a first end connected to the first floating diffusion node FD1 through the first path P1 of the first and second wiring structures 120 and 220.

In another exemplary embodiment, the second switching transistor SW2 may be formed on the lower surface of the second semiconductor substrate 210. The second switching transistor SW2 may have a first end connected to the second floating diffusion node FD2 through the second path P2' of the first and second wiring structures 120 and 220. The second path P2' may be a path separate from the first path P1, and may be provided by the second path P2*a*' of the first wiring layer 125 and the second path P2*b*' of the second wiring layer 225.

Also, the third floating diffusion node FD3 may be formed on the lower surface of the second semiconductor substrate 210, and may be disposed between the second terminal of the first switching transistor SW1 and the second terminal of the second switching transistor SW2.

In an exemplary embodiment, the reset transistor RG connected to the third floating diffusion node FD3 may be formed on the upper surface of the first semiconductor substrate 110. In this case, a first end of the reset transistor RG may be connected to the third floating diffusion node FD3 through a third path P3' of the first and second wiring structures 120 and 220, and the second end may be connected to a power source to apply a reset voltage. The third path P3' may be a path separate from the first path P1 and the second path P2', and may be provided by the third path P3$a$' of the first wiring layer 125 and the third path P3$b$' of the second wiring layer 225. In exemplary embodiments, the reset voltage may be the pixel voltage VPIX (see FIG. 2).

Differently from other exemplary embodiments, the reset transistor RG may be formed on the lower surface of the second semiconductor substrate 210. In this case, without the third path P3' by the first and second wiring layers 125 and 225, one end of the reset transistor RG formed on the lower surface of the second semiconductor substrate 210 may be configured to be connected to the third floating diffusion node FD3.

Referring to FIG. 8, the image sensor 500B according to an exemplary embodiment may be configured similarly to the image sensor 500 illustrated in FIGS. 1 to 6 other than the configuration in which the elements of the pixel circuit other than the first and second transfer transistors TG1 and TG2 and the first and second floating diffusion nodes FD1 and FD2 are formed on the lower surface of the second semiconductor substrate 210. Also, components of the exemplary embodiment may be understood with reference to descriptions of the same or similar components of the image sensor 500 illustrated in FIGS. 1 to 6 unless otherwise indicated.

Differently from the aforementioned exemplary embodiment (FIG. 7), the reset transistor RG (not illustrated) may be formed on the lower surface of the second semiconductor substrate 210 and may be connected to the third floating diffusion node FD3. In this case, wiring for the third path may not be provided. Also, the source follower transistor SF and the select transistor SX may be formed on the second semiconductor substrate 210.

Other than the first and second transfer transistors TG1 and TG2 and the first and second floating diffusion nodes FD1 and FD2 connected thereto, respectively, other elements of the pixel circuit may be formed on the lower surface of the second semiconductor substrate 210 employed as the memory chip 200.

According to the aforementioned exemplary embodiments, in the image sensor, instead of directly forming a capacitance element such as DRAM on a first semiconductor chip having a pixel array, a capacitance element may be formed on a separate second semiconductor chip (e.g., memory chip) and may be bonded to the first semiconductor chip, contamination of pixels may be prevented in the process of forming electrodes of capacitance elements. Also, by forming a portion of the elements of the pixel circuit (e.g., the first switch transistor) on the substrate of the memory chip, the overflow problem of electric charges generated in a switching device due to a pixel isolation structure such as front-side deep trench isolation (FDTI) in a split photodiode (split PD) structure may be addressed.

While exemplary embodiments have been illustrated and described above, it will be apparent to those skilled in the art that many modifications and variations could be made without departing from the spirit and scope of the present disclosure as defined by the appended claims.

What is claimed is:

1. An image sensor, comprising:
a first semiconductor chip including a first semiconductor substrate having a pixel array in which a plurality of pixels are arranged, and a first wiring structure disposed on the first semiconductor substrate, each of the plurality of pixels including a first photodiode and a second photodiode isolated from each other;
a second semiconductor chip including a second wiring structure disposed on the first wiring structure and having a capacitor, and a second semiconductor substrate disposed on the second wiring structure; and
a third semiconductor chip including a third wiring structure disposed on the second semiconductor chip, and a third semiconductor substrate disposed on the third wiring structure and having logic devices formed thereon,
wherein each of the plurality of pixels includes a first floating diffusion node storing electric charges generated by the first photodiode, a second floating diffusion node storing electric charges generated by the second photodiode, a third floating diffusion node disposed between the first and second floating diffusion nodes on the second photodiode, and a first switching transistor formed on a lower surface of the second semiconductor substrate, and
wherein the first switching transistor has a first end connected to the first floating diffusion node through a first path of the first and second wiring structures, and a second end connected to the third floating diffusion node through a second path of the first and second wiring structures.

2. The image sensor of claim 1, wherein the second photodiode has an area larger than that of the first photodiode.

3. The image sensor of claim 2,
wherein each of the plurality of pixels further includes a second switching transistor formed on an upper surface of the first semiconductor substrate, and
wherein the second switching transistor has a first end connected to the second floating diffusion node and a second end connected to the third floating diffusion node.

4. The image sensor of claim 1,
wherein each of the plurality of pixels includes:
a first transfer transistor connected between the first photodiode and the first floating diffusion node; and
a second transfer transistor connected between the second photodiode and the second floating diffusion node.

5. The image sensor of claim 4,
wherein each of the plurality of pixels further includes:
a reset transistor having a first end connected to the third floating diffusion node and a second end to which a reset voltage is applied;
a source follower transistor having a gate connected to the second floating diffusion node and one end to which a pixel voltage is applied;
a select transistor connected to the other end of the source follower transistor and outputting a pixel signal based on a select control signal.

6. The image sensor of claim 5, wherein at least one of the reset transistor, the source follower transistor, and the select transistor is formed on a lower surface of the second semiconductor substrate.

7. The image sensor of claim 5, wherein the capacitor includes a first electrode connected to the first floating diffusion node and a second electrode to which a capacitor voltage is applied.

8. The image sensor of claim 7, wherein the capacitor voltage is provided by the pixel voltage.

9. The image sensor of claim 1, wherein the capacitor includes a first electrode, a second electrode, and a dielectric film therebetween, and wherein at least one of the first and second electrodes includes a metal material different from a material of a first wiring layer of the first wiring structure.

10. The image sensor of claim 9, wherein a least one of the first and second electrodes includes tungsten, and the first wiring layer includes copper.

11. The image sensor of claim 9, wherein the capacitor has a cylindrical structure.

12. The image sensor of claim 1, wherein the first wiring structure includes a first bonding insulating layer disposed on an uppermost portion of the first wiring structure and a first metal pad in the first bonding insulating layer, and wherein the second wiring structure includes a second bonding insulating layer disposed in a lowermost portion of the second wiring structure and in contact with the first bonding insulating layer, and a second metal pad disposed in the second bonding insulating layer and in contact with the first metal pad.

13. The image sensor of claim 1, wherein the first semiconductor chip includes a pixel region in which the plurality of pixels are arranged and a peripheral circuit region surrounding the pixel region, and wherein the image sensor further includes a through-electrode penetrating the second semiconductor chip from the peripheral circuit region of the first semiconductor chip and electrically connected to the third semiconductor chip.

14. An image sensor, comprising:

a pixel array chip including a first semiconductor substrate having a pixel array in which a plurality of pixels are arranged, and a first wiring structure disposed on the first semiconductor substrate, each of the plurality of pixels including a first photodiode and a second photodiode isolated from each other;

a memory chip including a second wiring structure disposed on the first wiring structure and having a capacitor, and a second semiconductor substrate disposed on the second wiring structure; and a logic chip having a third wiring structure disposed on the memory chip and a third semiconductor substrate disposed on the third wiring structure and having logic devices formed thereon, wherein each of the plurality of pixels includes:

a first floating diffusion node configured to store electric charges generated by the first photodiode;

a second floating diffusion node configured to store electric charges generated by the second photodiode;

a first switching transistor formed on a lower surface of the second semiconductor substrate and having a first end connected to the first floating diffusion node through a first path of the first and second wiring structures;

a second switching transistor formed on the lower surface of the second semiconductor substrate and having a first end connected to the second floating diffusion node through a second path of the first and second wiring structures; and a third floating diffusion node formed on the lower surface of the second semiconductor substrate and connected between a second end of the first switching transistor and a second end of the second switching transistor.

15. The image sensor of claim 14, wherein each of the plurality of pixels further includes a reset transistor formed on an upper surface of the first semiconductor substrate and having a first end connected to the third floating diffusion node through a third path of the first and second wiring structures, and a second end to which a reset voltage is applied.

16. The image sensor of claim 14, wherein each of the plurality of pixels further includes a reset transistor formed on the lower surface of the second semiconductor substrate and having a first end connected to the third floating diffusion node and a second end to which a reset voltage is applied.

17. The image sensor of claim 14, wherein each of the plurality of pixels further includes:

a first transfer transistor connected between the first photodiode and the first floating diffusion node;

a second transfer transistor connected between the second photodiode and the second floating diffusion node;

a source follower transistor having a gate connected to the second floating diffusion node and one end to which a pixel voltage is applied; and a select transistor connected to the other end of the source follower transistor and outputting a pixel signal based on a select control signal.

18. The image sensor of claim 17, wherein the source follower transistor and the select transistor are formed on the second semiconductor substrate.

19. The image sensor of claim 14, wherein the capacitor includes a first electrode, a second electrode, and a dielectric film therebetween, and wherein at least one of the first and second electrodes includes a metal material different from a material of a first wiring layer of the first wiring structure.

20. An image sensor, comprising:

a first semiconductor chip including a first semiconductor substrate having a pixel array in which a plurality of pixels are arranged, and a first wiring structure disposed on the first semiconductor substrate, each of the plurality of pixels including a first photodiode and a second photodiode isolated from each other; and a second semiconductor chip including a second wiring structure disposed on the first wiring structure and having a capacitor and a second semiconductor substrate disposed on the second wiring structure, wherein the first wiring structure includes a first bonding insulating layer disposed on an uppermost portion of the first wiring structure and a first metal pad in the first bonding insulating layer, the second wiring structure includes a second bonding insulating layer disposed in a lowermost portion of the second wiring structure and in contact with the first bonding insulating layer, and a second metal pad connected to the first metal pad in the second bonding insulating layer, and a connection between the first and second metal pads provides electrical paths for the first and second wiring structures, wherein each of the plurality of pixels includes:

a first floating diffusion node configured to store electric charges generated by the first photodiode;

21

22 a second floating diffusion node configured to store electric charges generated by the second photodiode;

a third floating diffusion node disposed between the first and second floating diffusion nodes on the second photodiode; and a first switching transistor formed on a lower surface of the second semiconductor substrate, and wherein the first switching transistor has a first end connected to the first floating diffusion node through a first path of the first and second wiring structures, and a second end connected to the third floating diffusion node through a second path of the first and second wiring structures.

\* \* \* \* \*